United States Patent
Hokazono et al.

(10) Patent No.: US 10,291,220 B2
(45) Date of Patent: May 14, 2019

(54) LEVEL SHIFT CIRCUIT AND DRIVE CIRCUIT

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/697,476

(22) Filed: Sep. 7, 2017

(65) Prior Publication Data

US 2018/0175848 A1 Jun. 21, 2018

(30) Foreign Application Priority Data

Dec. 19, 2016 (JP) ................. 2016-245407

(51) Int. Cl.
| | | |
|---|---|---|
| *H03K 17/081* | (2006.01) | |
| *H03K 17/0812* | (2006.01) | |
| *G01J 5/06* | (2006.01) | |
| *G01J 5/12* | (2006.01) | |
| *G01J 5/16* | (2006.01) | |
| *H03K 17/0814* | (2006.01) | |
| *H01L 25/16* | (2006.01) | |
| *H03K 17/689* | (2006.01) | |
| *H03K 17/08* | (2006.01) | |

(52) U.S. Cl.
CPC ........ *H03K 17/08122* (2013.01); *G01J 5/061* (2013.01); *G01J 5/12* (2013.01); *G01J 5/16* (2013.01); *H01L 25/16* (2013.01); *H03K 17/08142* (2013.01); *H03K 17/689* (2013.01); *H03K 2017/0806* (2013.01)

(58) Field of Classification Search
CPC ............................................. H03K 17/08122
See application file for complete search history.

(56) References Cited

U.S. PATENT DOCUMENTS

| | | | |
|---|---|---|---|
| 2003/0067339 A1 | 4/2003 | Yamamoto | |
| 2006/0260793 A1* | 11/2006 | Yang | ........... H01L 23/34 165/185 |

FOREIGN PATENT DOCUMENTS

| | | |
|---|---|---|
| EP | 1 045 233 A2 | 10/2000 |
| JP | 2000-298062 A | 10/2000 |
| JP | 2003-115752 A | 4/2003 |
| JP | 2014-079075 A | 5/2014 |

* cited by examiner

*Primary Examiner* — Daniel C Puentes
(74) *Attorney, Agent, or Firm* — Studebaker & Brackett PC (57) ABSTRACT

A level shift circuit includes: an electrothermal converter converting a first electric signal with a first reference potential as a reference to heat; a thermoelectric converter converting the heat from the electrothermal converter to a second electric signal with a second reference potential which is different from the first reference potential as a reference; and an insulating region electrically insulating the electrothermal converter from the thermoelectric converter.

14 Claims, 10 Drawing Sheets

LEVEL SHIFT CIRCUIT AND DRIVE CIRCUIT

BACKGROUND OF THE INVENTION

Field

The present invention relates to a level shift circuit and a drive circuit.

Background

Level shift circuits for shifting the level of a drive signal from a low-potential side to a high-potential side are used to drive a semiconductor switching device on the high-potential side in drive circuits such as inverter apparatuses. Generally, HVICs (High Voltage Integrated Circuits), photocouplers, micro-transformers or the like are used as such level shift circuits (for example, see Patent Literature 1: JP 2003-115752 A).

An HVIC is constructed of PN junction isolation and electrically transmits a signal using a semiconductor device such as a MOSFET. A photocoupler is constructed of a light-emitting device such as a light-emitting diode and a light-receiving device such as a phototransistor, and transmits an electric signal by converting it to light. A micro-transformer is constructed of a coil and transmits an electric signal by converting it to magnetism.

However, with the HVIC, since the high-potential side is not electrically insulated from the low-potential side, noise on the high-potential side may transmit to the low-potential side. Since the photocoupler has a 2-chip configuration including the light-emitting device and the light-receiving device, it is difficult to miniaturize the photocoupler. The micro-transformer is also constructed of a plurality of chips just like the photocoupler, and so the micro-transformer is not only difficult to miniaturize but also more expensive than the HVIC and photocoupler.

SUMMARY

The present invention has been implemented to solve the above-described problems and it is an object of the present invention to provide a level shift circuit and a drive circuit which are electrically insulating, compact and low-cost.

According to the present invention, a level shift circuit includes: an electrothermal converter converting a first electric signal with a first reference potential as a reference to heat; a thermoelectric converter converting the heat from the electrothermal converter to a second electric signal with a second reference potential which is different from the first reference potential as a reference; and an insulating region electrically insulating the electrothermal converter from the thermoelectric converter.

In the present invention, an electric signal is converted to heat, and the heat is transmitted between different reference potentials electrically insulated in the insulating region and the signal is thereby transmitted. Since the high-potential side is electrically insulated from the low-potential side, noise on the high-potential side is never transmitted to the low-potential side. Since the circuit can be constructed of a single chip, integration is possible and the circuit can be miniaturized. In addition, the circuit can be implemented through low-cost semiconductor processes.

Other and further objects, features and advantages of the invention will appear more fully from the following description.

DESCRIPTION OF EMBODIMENTS

A level shift circuit and a drive circuit according to the embodiments of the present invention will be described with reference to the drawings. The same components will be denoted by the same symbols, and the repeated description thereof may be omitted.

First Embodiment

Figure 1:
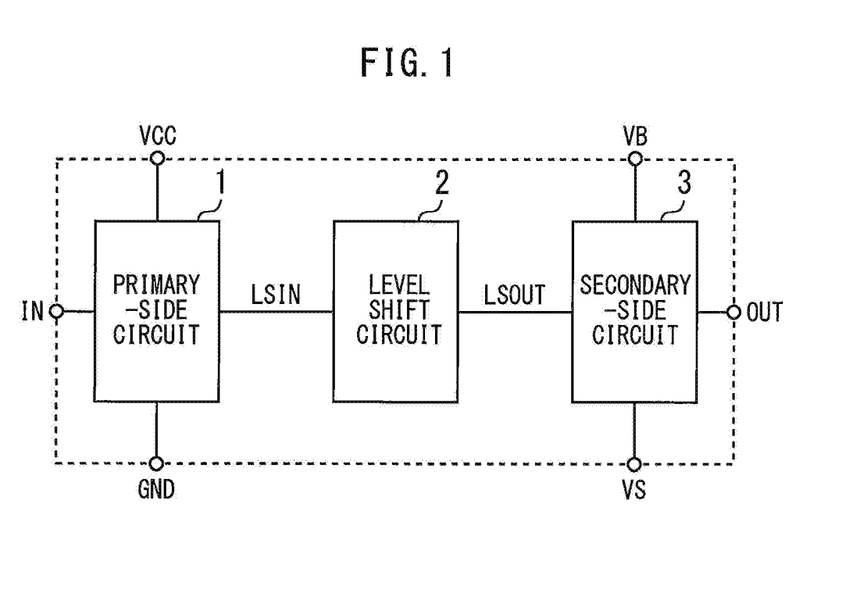
FIG. 1 is a block diagram illustrating a drive circuit according to a first embodiment of the present invention.

FIG. 1 is a block diagram illustrating a drive circuit according to a first embodiment of the present invention. This drive circuit drives a high-potential-side semiconductor switching device in an inverter apparatus or the like. A primary-side circuit 1 outputs an electric signal LSIN with a first reference potential GND as a reference in accordance with an input signal IN. A level shift circuit 2 converts the electric signal LSIN inputted from the primary-side circuit 1 to an electric signal LSOUT with a second reference potential VS which is different from the first reference potential GND as a reference. A secondary-side circuit 3 outputs a drive signal OUT with the second reference potential VS as a reference in accordance with the electric signal LSOUT inputted from the level shift circuit 2 to a control terminal of the switching device.

Figure 2:
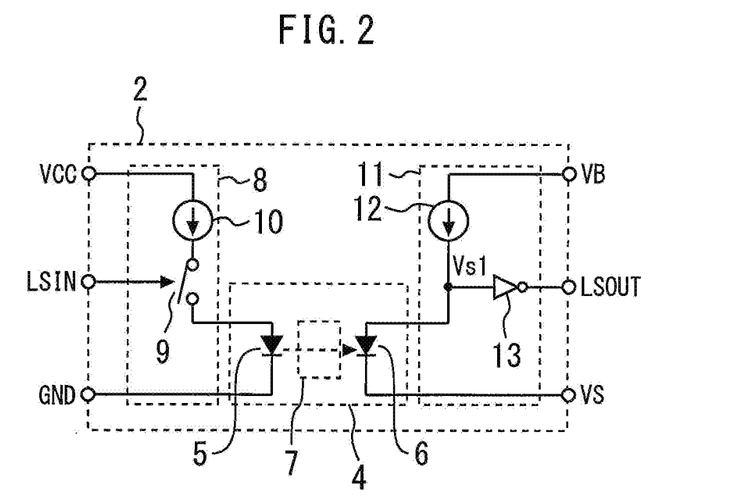
FIG. 2 is a circuit diagram illustrating the level shift circuit according to the first embodiment of the present invention.

FIG. 2 is a circuit diagram illustrating the level shift circuit according to the first embodiment of the present invention. A heat conduction section 4 includes an electrothermal converter 5, a thermoelectric converter 6 and an insulating region 7. The electrothermal converter 5 converts the electric signal LSIN to heat. The thermoelectric converter 6 converts the heat from the electrothermal converter 5 to the electric signal LSOUT. The insulating region 7 is an insulator or the like that electrically insulates the electrothermal converter 5 from the thermoelectric converter 6, and transmits the heat generated in the electrothermal converter 5 to the thermoelectric converter 6.

An electrothermal conversion circuit 8 switches a switch 9 in accordance with the electric signal LSIN. For example, when the electric signal LSIN is "high", the switch 9 is brought into conduction and supplies a current from a constant current source 10 to the electrothermal converter 5. The electrothermal converter 5 is a diode. When a current flows through the diode, power is consumed and heat is thereby generated.

With the heat from the electrothermal converter 5, a temperature of the thermoelectric converter 6 changes. Electrical characteristics of the thermoelectric converter 6, which is a diode, thereby change and an anode voltage Vs1 of the thermoelectric converter 6 changes. In a thermoelectric conversion circuit 11, a current of a constant current source 12 is supplied to the thermoelectric converter 6 and a change in the anode voltage Vs1 of the thermoelectric converter 6 caused by a change in an device temperature is detected using an inverter 13. For example, when the anode voltage Vs1 of the thermoelectric converter 6 decreases due to an increase in the device temperature and falls below a threshold of the inverter 13, the electric signal LSOUT becomes "high". Note that the electrothermal converter 5 and the thermoelectric converter 6 are not limited to diodes, but may be resistors, transistors or the like.

As described above, in the present embodiment, an electric signal is converted to heat, and the heat is transmitted between different reference potentials electrically insulated by the insulating region 7 and the signal is thereby transmitted. Since the high-potential side is electrically insulated from the low-potential side, noise on the high-potential side is never transmitted to the low-potential side. Since the circuit can be constructed of a single chip, integration is possible and the circuit can be miniaturized. In addition, the circuit can be implemented through low-cost semiconductor processes.

Figure 3:
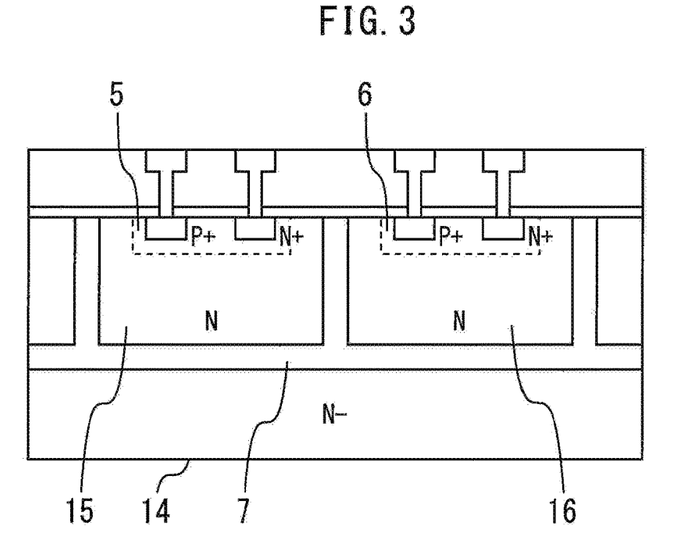
FIG. 3 is a cross-sectional view illustrating a first example of the heat conduction section according to the first embodiment of the present invention.

FIG. 3 is a cross-sectional view illustrating a first example of the heat conduction section according to the first embodiment of the present invention. A first N-type semiconductor region 15 and a second N-type semiconductor region 16 are formed on an N⁻-type semiconductor substrate 14. The first semiconductor region 15 and the second semiconductor region 16 are electrically insulated from each other by the insulating region 7. The insulating region 7 is, for example, an oxide film. The electrothermal converter 5 is formed in the first semiconductor region 15 and the thermoelectric converter 6 is formed in the second semiconductor region 16. In this way, heat conduction can be carried out between the first semiconductor region 15 and the second semiconductor region 16.

Figure 4:
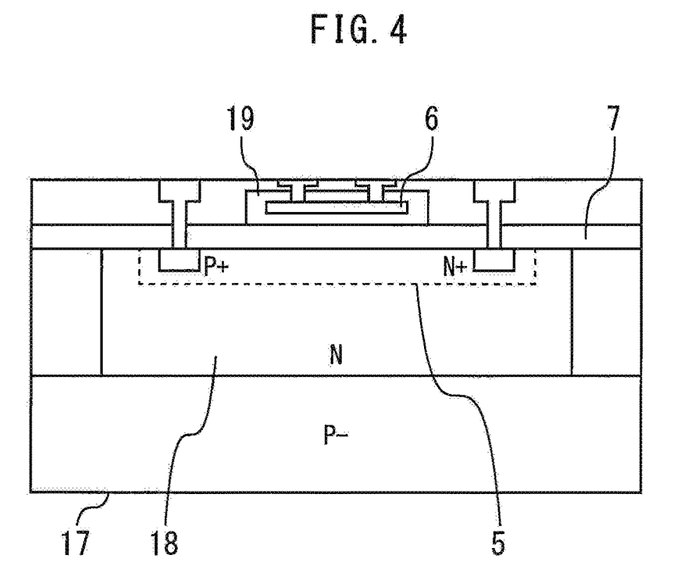
FIG. 4 is a cross-sectional view illustrating a second example of the heat conduction section according to the first embodiment of the present invention.

FIG. 4 is a cross-sectional view illustrating a second example of the heat conduction section according to the first embodiment of the present invention. An N-type semiconductor region 18 is formed on a P⁻-type semiconductor substrate 17. A laminated region 19 is formed above the N-type semiconductor region 18. The N-type semiconductor region 18 and the laminated region 19 are insulated from each other by the insulating region 7. The electrothermal converter 5 is formed in the N-type semiconductor region 18 and the thermoelectric converter 6 is formed in the laminated region 19. In this way, heat conduction can be carried out between the N-type semiconductor region 18 and the laminated region 19. In FIG. 3 and FIG. 4, the electrothermal converter 5, the thermoelectric converter 6 and the insulating region 7 are formed in a single chip, and therefore the insulating devices can be integrated. Note that the electrothermal conversion circuit 8, the thermoelectric conversion circuit 11, the primary-side circuit 1 and the secondary-side circuit 3 can also be formed in the single chip.

Second Embodiment

Figure 5:
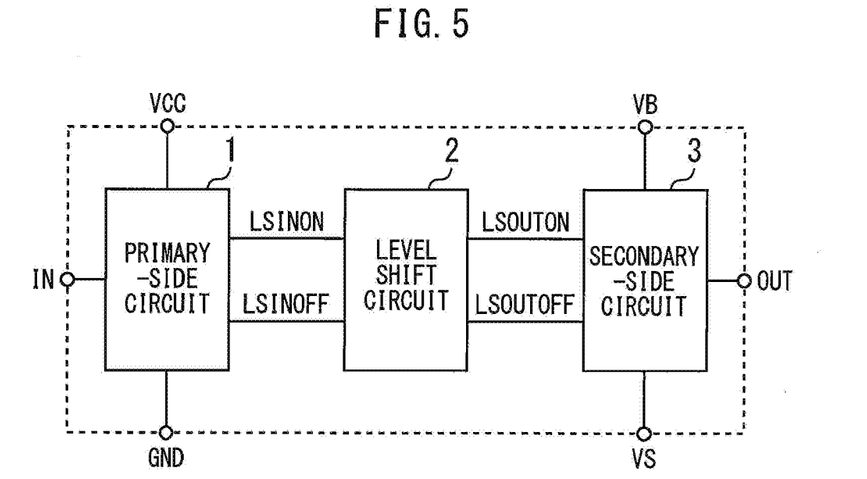
FIG. 5 is a block diagram illustrating a drive circuit according to a second embodiment of the present invention.

FIG. 5 is a block diagram illustrating a drive circuit according to a second embodiment of the present invention. The primary-side circuit 1 outputs an electric signal LSINON synchronized with an input signal IN and an electric signal LSINOFF synchronized with a signal obtained by inverting the input signal. The level shift circuit 2 converts the electric signal LSINON and the electric signal LSINOFF with the first reference potential GND as a reference to an electric signal LSOUTON and an electric signal LSOUTOFF with the second reference potential VS as a reference. The secondary-side circuit 3 outputs the drive signal OUT with the second reference potential VS as a reference in accordance with the electric signal LSOUTON and the electric signal LSOUTOFF inputted from the level shift circuit 2.

Figure 6:
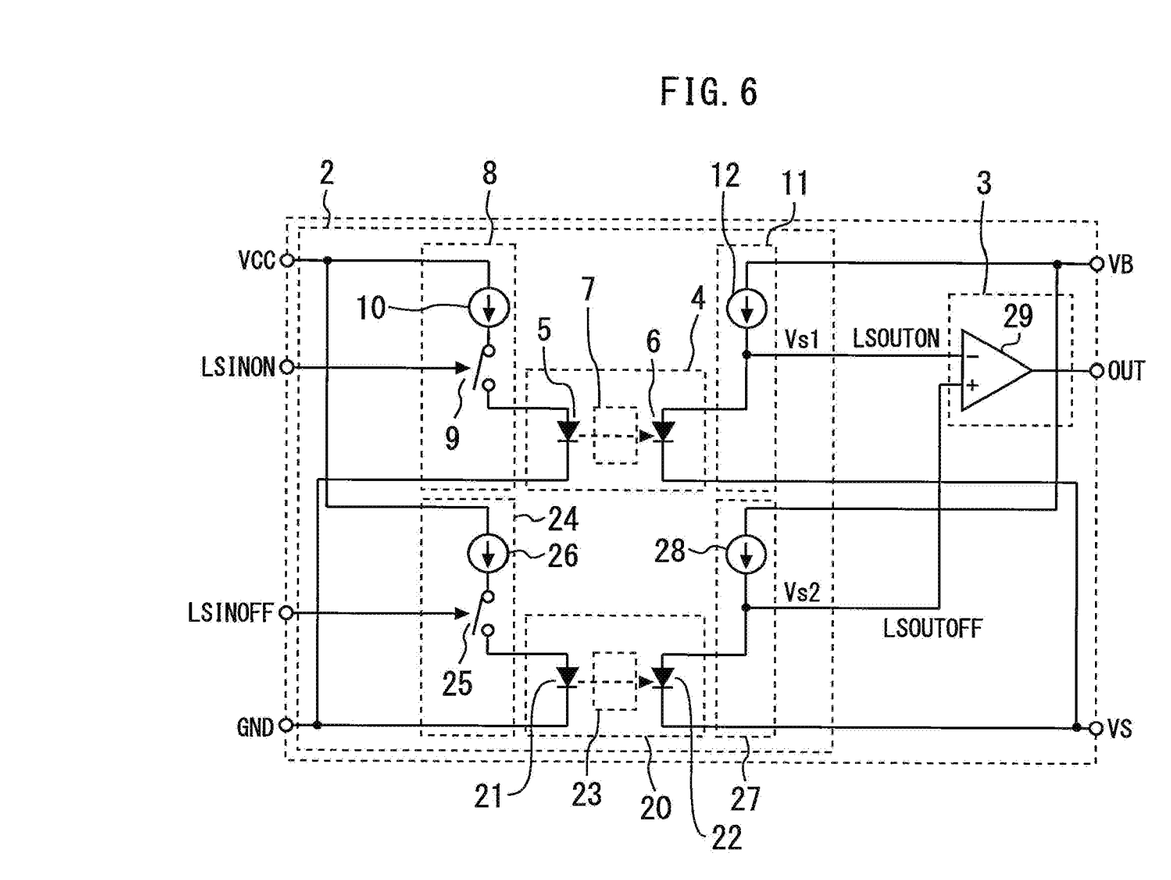
FIG. 6 is a circuit diagram illustrating the level shift circuit and the secondary-side circuit according to the second embodiment of the present invention.

FIG. 6 is a circuit diagram illustrating the level shift circuit and the secondary-side circuit according to the second embodiment of the present invention. In the heat conduction section 4, the electrothermal converter 5 converts the electric signal LSINON to heat and the thermoelectric converter 6 converts the heat from the electrothermal converter 5 to the electric signal LSOUTON. A heat conduction section 20 includes an electrothermal converter 21, a thermoelectric converter 22 and an insulating region 23. The electrothermal converter 21 converts the electric signal LSINOFF to heat. The thermoelectric converter 22 converts the heat from the electrothermal converter 21 to the electric signal LSOUTOFF. The insulating region 23 is an insulator or the like that electrically insulates the electrothermal converter 21 from the thermoelectric converter 22, and transmits the heat generated in the electrothermal converter 21 to the thermoelectric converter 22. Note that the insulating regions 7 and 23 may be integrated into one.

The electrothermal conversion circuit 8 switches the switch 9 in accordance with the electric signal LSINON and switches a current supply from the constant current source 10 to the electrothermal converter 5. The electrothermal conversion circuit 24 switches the switch 25 in accordance with the electric signal LSINOFF and switches a current supply from the constant current source 26 to the electrothermal converter 21. For example, when the input signal IN is "high", the electric signal LSINON becomes "high", the switch 9 is brought into conduction and the electrothermal converter 5 thereby generates heat. On the other hand, when the input signal IN is "low", the electric signal LSINOFF becomes "high", the switch 25 is brought into conduction and the electrothermal converter 21 thereby generates heat. Thus, by causing the electrothermal conversion circuit 8 and the electrothermal conversion circuit 24 to operate separately, it is possible to complementarily transmit ON and OFF of the input signal IN.

In the thermoelectric conversion circuit 11, the current of the constant current source 12 is supplied to the thermoelectric converter 6 and the anode voltage Vs1 of the thermoelectric converter 6 which changes according to the device temperature is outputted as the electric signal LSOUTON. In a thermoelectric conversion circuit 27, the current of the constant current source 28 is supplied to the thermoelectric converter 22 and an anode voltage Vs2 of the thermoelectric converter 22 which changes according to the device temperature is outputted as the electric signal LSOUTOFF. In this way, heat values detected by the thermoelectric converters 6 and 22 are converted to electric signals.

In the secondary-side circuit 3, a comparator 29 compares the electric signal LSOUTON with the electric signal LSOUTOFF and outputs the drive signal OUT. For example, when the input signal IN is "high", the electrothermal converter 5 generates heat, the anode voltage Vs1 of the thermoelectric converter 6 thereby decreases, Vs1 becomes lower than Vs2, and therefore the drive signal OUT becomes "high". When the input signal IN is "low", the electrothermal converter 21 generates heat, the anode voltage Vs2 of the thermoelectric converter 22 thereby decreases, Vs2 becomes lower than Vs1, and therefore the drive signal OUT becomes "low".

Third Embodiment

Figure 7:
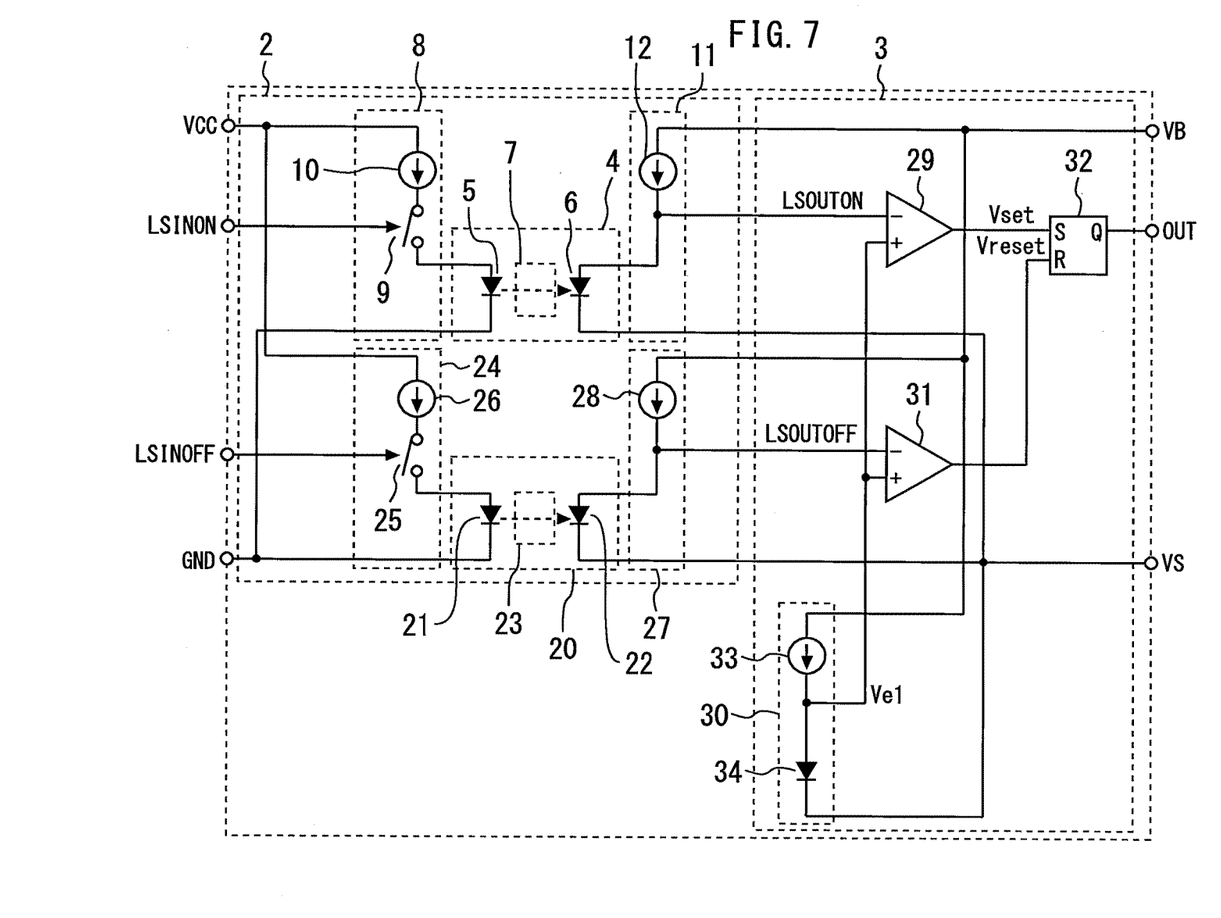
FIG. 7 is a circuit diagram illustrating a level shift circuit and a secondary-side circuit according to a third embodiment of the present invention.

FIG. 7 is a circuit diagram illustrating a level shift circuit and a secondary-side circuit according to a third embodiment of the present invention. The third embodiment is different from the second embodiment in that the secondary-side circuit 3 includes a constant voltage circuit 30, comparators 29 and 31, and a signal holding circuit 32. The constant voltage circuit 30 includes a constant current source 33 and a diode 34, and generates a reference voltage Ve1.

The comparator 29 compares the electric signal LSOUTON with the reference voltage Ve1. For example, when the thermoelectric converter 6 detects heat, the electric signal LSOUTON decreases, and an output voltage Vset of the comparator 29 becomes "high". Similarly, the comparator 31 compares the electric signal LSOUTOFF with the reference voltage Ve1. For example, when the thermoelectric converter 22 detects heat, the electric signal LSOUTOFF decreases, and an output voltage Vreset of the comparator 31 becomes "high".

The signal holding circuit 32 is an SR-FF and receives the output voltage Vset of the comparator 29 as a set signal, receives an output voltage Vreset of the comparator 31 as a reset signal, and generates a drive signal OUT. The signal holding circuit 32 sets "high" the drive signal OUT in synchronization with a rising edge of the output voltage Vset of the comparator 29 and sets "low" the drive signal OUT in synchronization with a rising edge of the output voltage Vreset of the comparator 31.

Thus, it is possible to transmit an input signal by converting it to a pulse signal, and thereby prevent heat generation. More specifically, the electric signal LSINON outputted from the primary-side circuit 1 is designated as a first ON pulse synchronized with the rising edge of the input signal IN and the electric signal LSINOFF is designated as a second OFF pulse synchronized with the falling edge of the input signal IN. The electric signal LSOUTON outputted from the level shift circuit 2 becomes a second ON pulse whose voltage level is shifted from that of the first ON pulse and the electric signal LSOUTOFF becomes a second OFF pulse whose voltage level is shifted from that of the first OFF pulse. The secondary-side circuit 3 outputs a pulse signal that rises in synchronization with the second ON pulse and falls in synchronization with the second OFF pulse as the drive signal OUT.

Fourth Embodiment

Figure 8:
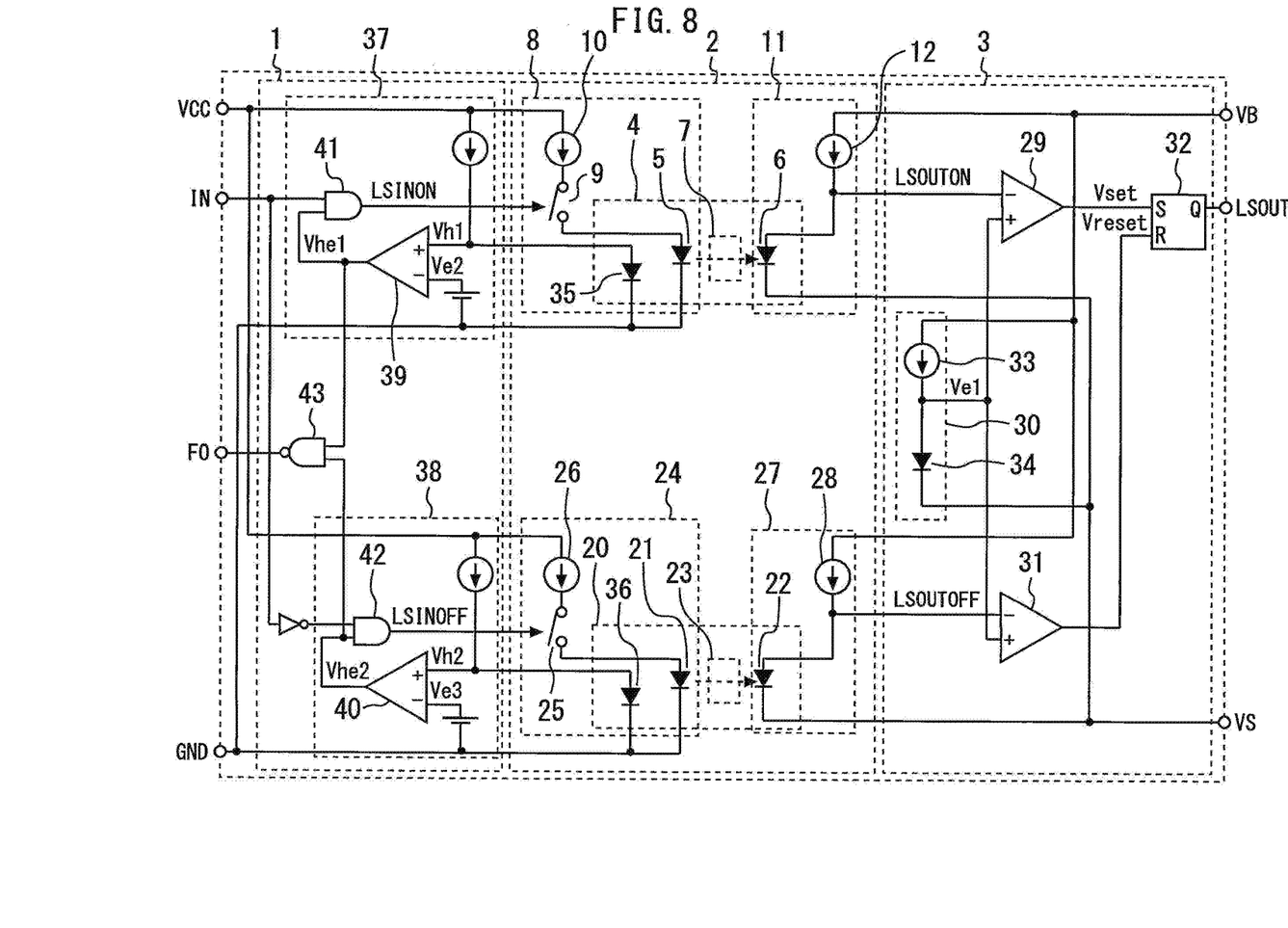
FIG. 8 is a circuit diagram illustrating a drive circuit according to a fourth embodiment of the present invention.

FIG. 8 is a circuit diagram illustrating a drive circuit according to a fourth embodiment of the present invention. In addition to the configuration of the third embodiment, the drive circuit is provided with thermoelectric converters 35 and 36, and overheat prevention circuits 37 and 38 in the primary-side circuit 1. The thermoelectric converters 35 and 36 detect heat generated in the electrothermal converters 5 and 21 respectively, and are preferably arranged adjacent to the electrothermal converters 5 and 21.

In the overheat prevention circuits 37 and 38, when anode voltages Vh1 and Vh2 of the thermoelectric converters 35 and 36 become lower than reference voltages Ve2 and Ve3 due to overheating of the electrothermal converters 5 and 21 respectively, output voltages Vhe1 and Vhe2 of the comparators 39 and 40 become "low". Outputs of AND circuits 41 and 42 become "low", the switches 9 and 25 are thereby set to a disconnected state thus stopping heat generation of the electrothermal converters 5 and 21. Note that the reference voltages Ve2 and Ve3 are set such that heat generation at the electrothermal converters 5 and 21 may be sufficiently detected on the secondary side.

Thus, the overheat prevention circuits 37 and 38 detect heat generated in the electrothermal converters 5 and 21, and suppresses, when the temperature exceeds a reference value, heat values of the electrothermal converters 5 and 21. In this way, when the electrothermal converters 5 and 21 are overheated beyond a detectable level of the secondary side, the heat generation is stopped and thereby destruction of the device and thermal runaway can be prevented.

Note that in FIG. 8, the AND circuits 41 and 42 operate the switches 9 and 25 to completely stop heat generation, but it may also be possible to adjust current values of the constant current sources 10 and 26 by the output voltages Vhe1 and Vhe2 of the comparators 39 and 40, and suppress the heat values. When either the output voltage Vhe1 or Vhe2 becomes "low", an error signal FO outputted from a NAND circuit 43 becomes "high".

Fifth Embodiment

Figure 9:
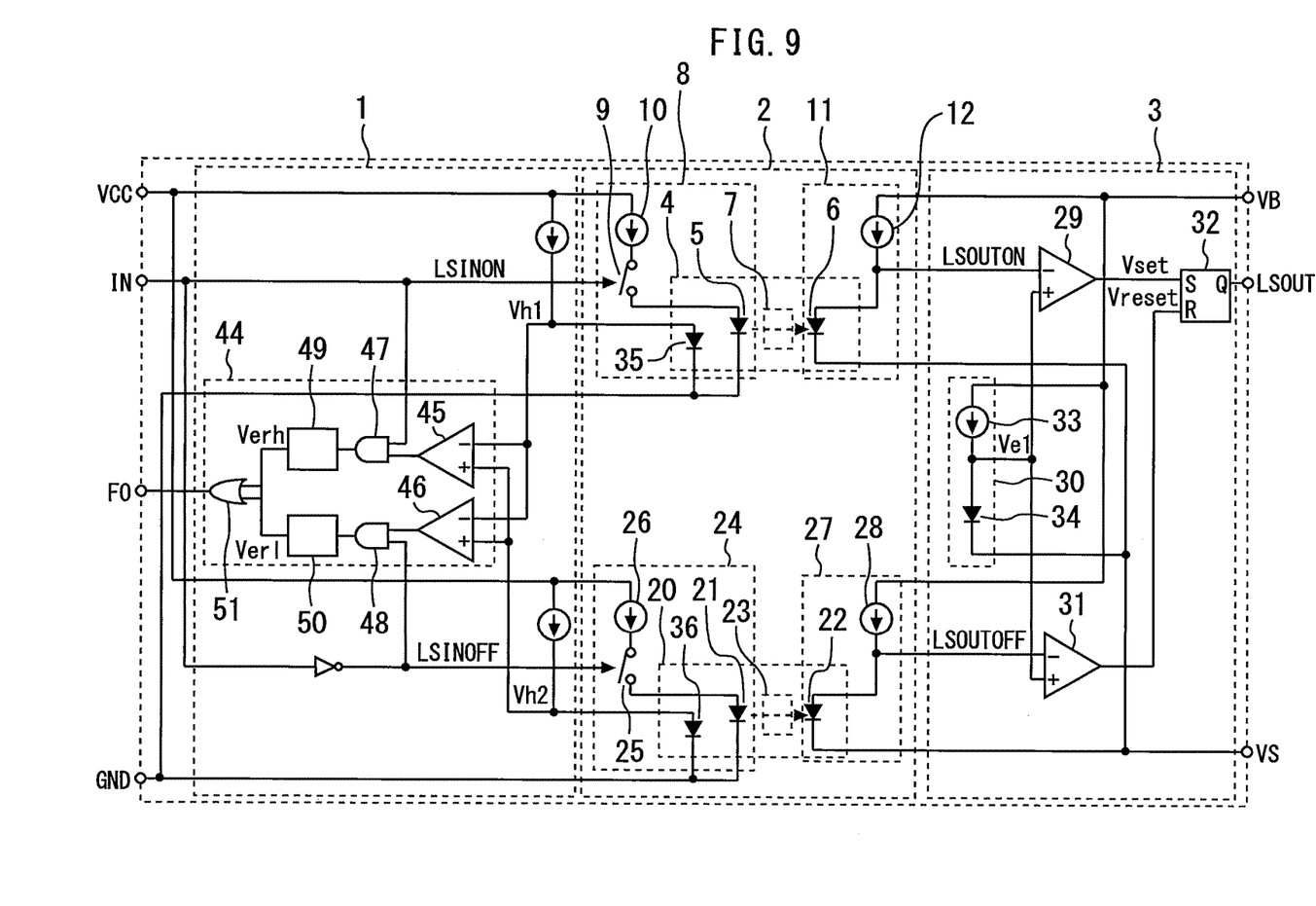
FIG. 9 is a circuit diagram illustrating a drive circuit according to a fifth embodiment of the present invention.

FIG. 9 is a circuit diagram illustrating a drive circuit according to a fifth embodiment of the present invention. An insufficient heat generation determination circuit 44 is provided instead of the overheat prevention circuits 37 and 38 in the fourth embodiment. The insufficient heat generation determination circuit 44 includes comparators 45 and 46, AND circuits 47 and 48, filter circuits 49 and 50, and an OR circuit 51.

The comparators 45 and 46 receive the anode voltages Vh1 and Vh2 of thermoelectric converters 35 and 36 respectively. When the electrothermal converter 5 generates heat and the anode voltage Vh1 decreases, an output of the comparator 45 becomes "low", and when the electrothermal converter 21 generates heat and the anode voltage Vh2 decreases, an output of the comparator 46 becomes "low".

The AND circuit 47 outputs logical AND of an input signal IN and an output signal of the comparator 45. The AND circuit 48 outputs logical AND of an inverted signal of the input signal IN and an output signal of the comparator 46. When the input signal IN is "high" and the output of the comparator 45 is "high", that is, the electrothermal converter 5 does not generate heat despite the fact that the input signal IN is "high", the output of the AND circuit 47 becomes "high". When the input signal IN is "low" and the output of the comparator 46 is "high", that is, the electrothermal converter 5 does not generate heat despite the fact that the input signal IN is "low", the output of the AND circuit 48 becomes "high".

The filter circuits 49 and 50 are circuits that set "high" the output voltages Verh and Verl when the outputs of the AND circuits 47 and 48 are kept "high" for a predetermined period of time, and are inserted to prevent erroneous determination when the input signal IN is switched. When the outputs of the AND circuits 47 and 48 remain "high" for a predetermined period of time or longer, the output voltages Verh and Verl become "high" and an error signal FO outputted from the OR circuit 51 becomes "high".

Therefore, the insufficient heat generation determination circuit 44 detects heat generated in the electrothermal converters 5 and 21, and outputs an error signal FO when the heat does not reach a reference value within a predetermined period of time. It is thereby possible to detect insufficient heat generation.

Sixth Embodiment

Figure 10:
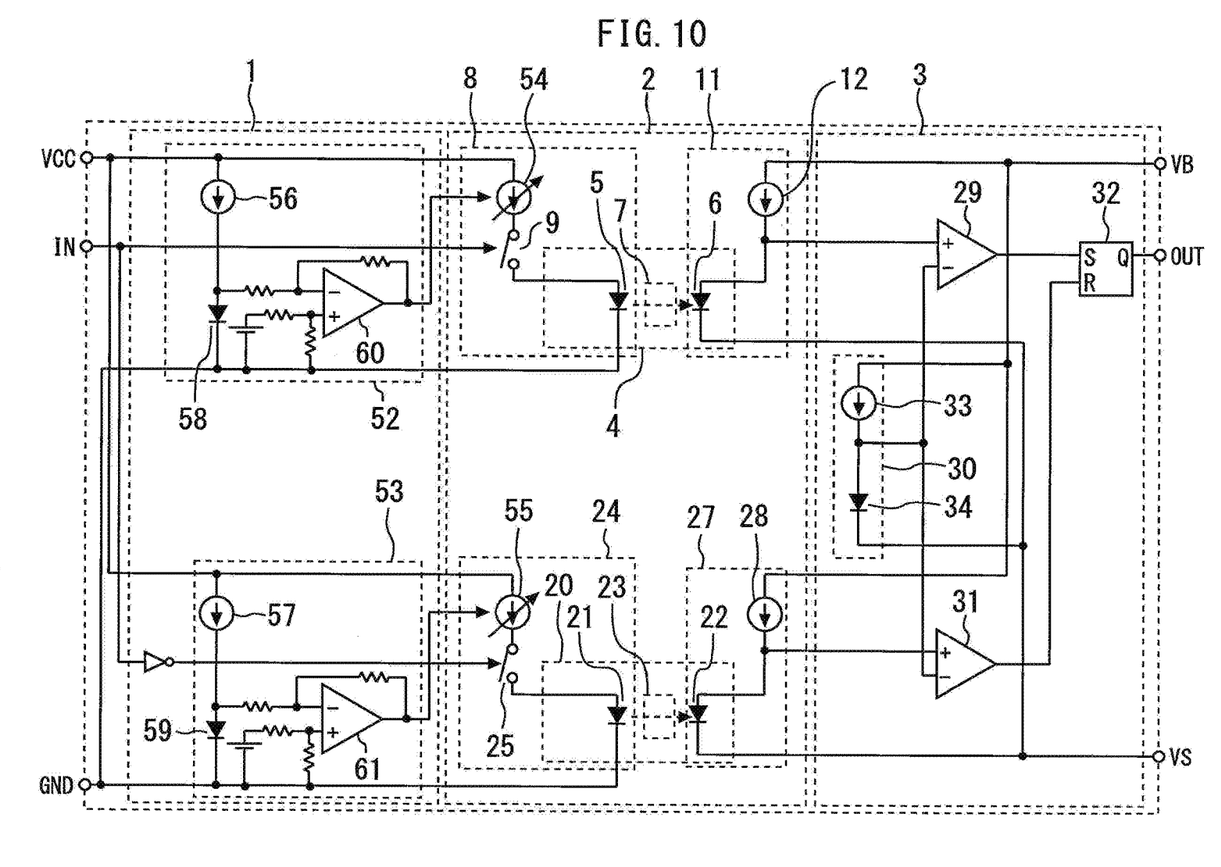
FIG. 10 is a circuit diagram illustrating a drive circuit according to a sixth embodiment of the present invention.

FIG. 10 is a circuit diagram illustrating a drive circuit according to a sixth embodiment of the present invention. The drive circuit is provided with heat value adjustment circuits 52 and 53 in addition to the configuration of the third embodiment. The drive circuit is provided with variable current sources 54 and 55 instead of the constant current sources 10 and 26 in the third embodiment.

The heat value adjustment circuits 52 and 53 detect ambient temperatures, in other words, chip temperatures of the drive circuit using constant current sources 56 and 57, and thermoelectric converters 58 and 59 respectively. Comparators 60 and 61 adjust current values of the variable current sources 54 and 55 respectively in accordance with the detected chip temperatures and adjust heat values of the electrothermal converters 5 and 21. For example, when the chip temperature is high, the comparators 60 and 61 reduce the current values of the variable current sources 54 and 55 and suppress heat values of the electrothermal converters 5 and 21 to prevent destruction by overheating.

Seventh Embodiment

Figure 11:
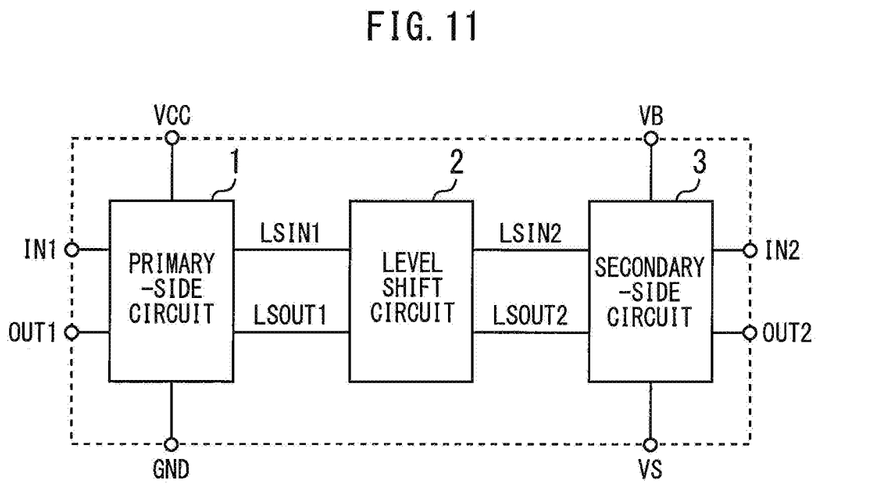
FIG. 11 is a block diagram illustrating a drive circuit according to a seventh embodiment of the present invention.

FIG. 11 is a block diagram illustrating a drive circuit according to a seventh embodiment of the present invention. The primary-side circuit 1 selectively switches whether to output an electric signal LSIN1 in accordance with an input signal IN1 or output a drive signal OUT1 in accordance with an electric signal LSOUT1.

The level shift circuit 2 shifts the level of the electric signal LSIN1 with a first reference potential as a reference, converts it to an electric signal LSOUT2 with a second reference potential as a reference or shifts the level of the electric signal LSIN2 with a second reference potential as a reference, converts it to an electric signal LSOUT1 with the first reference potential as a reference.

The secondary-side circuit 3 selectively switches whether to output a drive signal OUT2 in accordance with the electric signal LSOUT2 with the second reference potential as a reference or output the electric signal LSIN2 in accordance with an input signal IN2.

Figure 12:
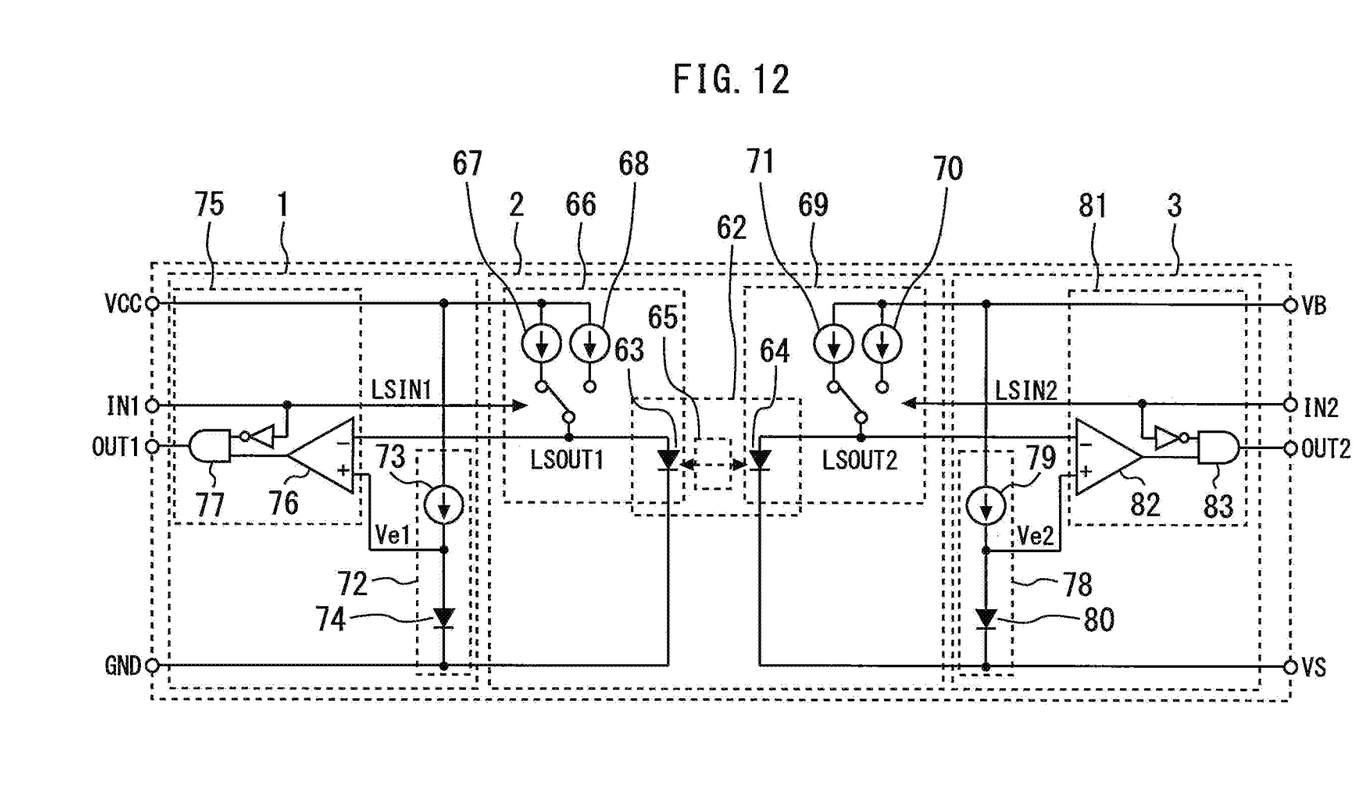
FIG. 12 is a circuit diagram illustrating the drive circuit according to the seventh embodiment of the present invention.

FIG. 12 is a circuit diagram illustrating the drive circuit according to the seventh embodiment of the present invention. A heat conduction section 62 includes a first converter 63, a second converter 64 and an insulating region 65. The first converter 63 is a diode that converts the electric signal LSIN1 from the primary-side circuit 1 to heat or converts heat from the second converter 64 to the electric signal LSOUT1 and outputs it to the primary-side circuit 1. The second converter 64 is a diode that converts heat from the first converter 63 to the electric signal LSOUT2 and outputs it to the secondary-side circuit 3 or converts the electric signal LSIN2 from the secondary-side circuit 3 to heat and outputs it to the first converter 63. The insulating region 65 electrically insulates the first converter 63 from the second converter 64.

An electrothermal conversion circuit 66 supplies a current to the first converter 63 from a constant current source 67 when the input signal IN1 is "high", and supplies a current to the converter 63 from the constant current source 68 when the input signal IN1 is "low". An electrothermal conversion circuit 69 supplies a current to the second converter 64 from the constant current source 70 when the input signal IN2 is "high", and supplies a current to the second converter 64 from a constant current source 71 when the input signal IN2 is "low". The input signals IN1 and IN2 are set so as not to simultaneously become "high".

Current values of the constant current sources 67 and 70 are greater than current values of the constant current sources 68 and 71, and are current values enough to cause the first converter 63 or the second converter 64 to generate heat. Current values of the constant current sources 68 and 71 are current values enough to cause the first converter 63 or the second converter 64 to carry out heat conduction.

In the primary-side circuit 1, a constant voltage circuit 72 includes a constant current source 73 and a diode 74 and generates a reference voltage Ve1. A comparator 76 of a thermoelectric conversion circuit 75 compares the electric signal LSOUT1 with the reference voltage Ve1. When the input signal IN1 is "low" and the electric signal LSOUT1 is smaller than the reference voltage Ve1, an AND circuit 77 causes the drive signal OUT1 to become "high".

In the secondary-side circuit 3, a constant voltage circuit 78 includes a constant current source 79 and a diode 80 and generates a reference voltage Ve2. A comparator 82 of a thermoelectric conversion circuit 81 compares the electric signal LSOUT2 with the reference voltage Ve2. When the input signal IN2 is "low" and the electric signal LSOUT2 is smaller than the reference voltage Ve2, an AND circuit 83 causes the drive signal OUT2 to become "high".

According to the present embodiment, by switching between a heat generating mode and a heat receiving mode of the primary-side circuit 1 and the secondary-side circuit 3 in accordance with an input signal, it is possible to realize bi-directional signal transmissions. For example, when the input signal IN1 is "high" and the input signal IN2 is "low", the first converter 63 generates heat as an electrothermal conversion mode and the second converter 64 accepts heat generation as a thermoelectric conversion mode. In this way, it is possible to realize signal transmissions from the primary-side to the secondary-side. On the other hand, when the input signal IN1 is "low" and the input signal IN2 is "high", it is possible to realize signal transmissions from the secondary-side to the primary-side.

Note that the first to seventh embodiments are illustrated by way of examples and the present invention is not limited to these embodiments. An infinite number of modifications not yet illustrated can be conceived without departing from the scope of the present invention. Those embodiments may be freely combined, modified or omitted without departing from the scope of the present invention.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-245407, filed on Dec. 19, 2016 including specification, claims, drawings and summary, on which the Convention priority of the present application is based, is incorporated herein by reference in its entirety.

The invention claimed is:

1. A level shift circuit comprising:
    an electrothermal converter converting a first electric signal with a first reference potential as a reference to heat;
    a thermoelectric converter converting the heat from the electrothermal converter to a second electric signal with a second reference potential which is different from the first reference potential as a reference; and
    an insulating region electrically insulating the electrothermal converter from the thermoelectric converter, wherein the electrothermal converter and thermoelectric converter are semiconductor regions integrated with the insulating region in a single semiconductor chip.

2. A level shift circuit comprising:
an electrothermal converter converting a first electric signal with a first reference potential as a reference to heat;
a thermoelectric converter converting the heat from the electrothermal converter to a second electric signal with a second reference potential which is different from the first reference potential as a reference; and
an insulating region electrically insulating the electrothermal converter from the thermoelectric converter, wherein
the electrothermal converter, the thermoelectric converter and the insulating region are provided in a single chip,
the electrothermal converter and the thermoelectric converter are respectively provided in two semiconductor regions, which are positioned on a surface of a semiconductor substrate next to one another in a direction parallel to the surface and insulated from one another by the insulating region.

3. A drive circuit driving a switching device, comprising:
a primary-side circuit outputting the first electric signal in accordance with an input signal;
the level shift circuit according to claim 2; and
a secondary-side circuit outputting a drive signal with the second reference potential as a reference in accordance with the second electric signal.

4. The drive circuit according to claim 3, wherein the primary-side circuit outputs, as the first electric signal, a first ON pulse synchronized with a rising edge of the input signal and a first OFF pulse synchronized with a falling edge of the input signal,
the level shift circuit outputs, as the second electric signal, a second ON pulse whose voltage level is shifted from that of the first ON pulse and a second OFF pulse whose voltage level is shifted from that of the first OFF pulse, and
the secondary-side circuit outputs a pulse signal that rises in synchronization with the second ON pulse and falls in synchronization with the second OFF pulse as the drive signal.

5. The drive circuit according to claim 3, further comprising an overheat prevention circuit detecting the heat generated in the electrothermal converter and suppressing a heat value of the electrothermal converter when the heat exceeds a reference value.

6. The drive circuit according to claim 3, further comprising an insufficient heat generation determination circuit detecting the heat generated in the electrothermal converter and outputting an error signal when the heat does not reach a reference value within a predetermined period of time.

7. The drive circuit according to claim 3, further comprising a heat value adjustment circuit detecting a chip temperature of the drive circuit and adjusting a heat value of the electrothermal converter in accordance with the chip temperature.

8. A level shift circuit comprising:
an electrothermal converter converting a first electric signal with a first reference potential as a reference to heat;
a thermoelectric converter converting the heat from the electrothermal converter to a second electric signal with a second reference potential which is different from the first reference potential as a reference; and
an insulating region electrically insulating the electrothermal converter from the thermoelectric converter,
wherein one of the electrothermal converter and the thermoelectric converter is provided in a semiconductor region, the other one is provided in a laminated region on the semiconductor region, and the semiconductor region and the laminated region are insulated from each other by the insulating region.

9. A drive circuit driving a switching device, comprising:
a primary-side circuit outputting a first electric signal in accordance with an input signal;
a level shift circuit comprising:
an electrothermal converter converting the first electric signal with a first reference potential as a reference to heat;
a thermoelectric converter converting the heat from the electrothermal converter to a second electric signal with a second reference potential which is different from the first reference potential as a reference; and
an insulating region electrically insulating the electrothermal converter from the thermoelectric converter; and
a secondary-side circuit outputting a drive signal with the second reference potential as a reference in accordance with the second electric signal.

10. The drive circuit according to claim 9, wherein the primary-side circuit outputs, as the first electric signal, a first ON pulse synchronized with a rising edge of the input signal and a first OFF pulse synchronized with a falling edge of the input signal,
the level shift circuit outputs, as the second electric signal, a second ON pulse whose voltage level is shifted from that of the first ON pulse and a second OFF pulse whose voltage level is shifted from that of the first OFF pulse, and
the secondary-side circuit outputs a pulse signal that rises in synchronization with the second ON pulse and falls in synchronization with the second OFF pulse as the drive signal.

11. The drive circuit according to claim 9, further comprising an overheat prevention circuit detecting the heat generated in the electrothermal converter and suppressing a heat value of the electrothermal converter when the heat exceeds a reference value.

12. The drive circuit according to claim 9, further comprising an insufficient heat generation determination circuit detecting the heat generated in the electrothermal converter and outputting an error signal when the heat does not reach a reference value within a predetermined period of time.

13. The drive circuit according to claim 9, further comprising a heat value adjustment circuit detecting a chip temperature of the drive circuit and adjusting a heat value of the electrothermal converter in accordance with the chip temperature.

14. A drive circuit driving a switching device, comprising:
a primary-side circuit selectively switching whether to output a first electric signal with a first reference potential as a reference in accordance with an input signal or output a drive signal in accordance with the first electric signal;
a secondary-side circuit selectively switching whether to output the drive signal in accordance with a second electric signal with a second reference potential which is different from the first reference potential as a reference or output the second electric signal in accordance with the input signal;

a first converter converting the first electric signal from the primary-side circuit to heat or converting heat to the first electric signal and outputting the first electric signal to the primary-side circuit;

a second converter converting the heat from the first converter to the second electric signal and outputting the second electric signal to the secondary-side circuit or converting the second electric signal from the secondary-side circuit to the heat and outputs the heat to the first converter; and an insulating region electrically insulating the first converter from the second converter.

* * * * *